(12) United States Patent
Kramer et al.

(10) Patent No.: US 10,578,959 B2
(45) Date of Patent: Mar. 3, 2020

(54) SUPPORT APPARATUS, LITHOGRAPHIC APPARATUS AND DEVICE MANUFACTURING METHOD

(71) Applicant: ASML NETHERLANDS B.V., Veldhoven (NL)

(72) Inventors: Gijs Kramer, Nijmegen (NL); Simon Karel Ravensbergen, Veldhoven (NL); Niek Jacobus Johannes Roset, Eindhoven (NL); Pieter Renaat Maria Hennus, Peer (BE)

(73) Assignee: ASML Netherlands B.V., Veldhoven (NL)

( * ) Notice: Subject to any disclaimer, the term of this patent is extended or adjusted under 35 U.S.C. 154(b) by 24 days.

(21) Appl. No.: 15/567,279

(22) PCT Filed: Mar. 22, 2016

(86) PCT No.: PCT/EP2016/056235
§ 371 (c)(1),
(2) Date: Oct. 17, 2017

(87) PCT Pub. No.: WO2016/173779
PCT Pub. Date: Nov. 3, 2016

(65) Prior Publication Data
US 2018/0107107 A1    Apr. 19, 2018

(30) Foreign Application Priority Data
Apr. 29, 2015   (EP) .................................... 15165563

(51) Int. Cl.
*G03B 27/42* (2006.01)
*G03F 7/20* (2006.01)

(52) U.S. Cl.
CPC ......... *G03B 27/42* (2013.01); *G03F 7/70341* (2013.01); *G03F 7/70716* (2013.01)

(58) Field of Classification Search
CPC ............. G03F 7/70341; G03F 7/70716; G03F 7/2041; G03F 7/20; G03F 7/707; G03F 7/70325; G03F 7/70825
See application file for complete search history.

(56) References Cited

U.S. PATENT DOCUMENTS

| 4,509,852 A | 4/1985 | Tabarelli et al. |
| 2004/0207824 A1 | 10/2004 | Lof et al. |

(Continued)

FOREIGN PATENT DOCUMENTS

| EP | 1420298 | 5/2004 |
| EP | 1429188 | 6/2004 |

(Continued)

OTHER PUBLICATIONS

International Search Report for corresponding International Patent Application No. PCT/EP2016/056235 dated Jun. 28, 2016.

(Continued)

*Primary Examiner* — Mesfin T Asfaw
(74) *Attorney, Agent, or Firm* — Pillsbury Winthrop Shaw Pittman, LLP

(57) ABSTRACT

A support apparatus for a lithographic apparatus has an object holder and an extraction body radially outward of the object holder. The object holder is configured to support an object. The extraction body includes an extraction opening configured to extract fluid from a top surface of the support apparatus. The extraction body is spaced from the object holder such that the extraction body is substantially decoupled from the object holder. The extraction body includes a projection configured such that it surrounds the object holder and such that, in use, a layer of immersion liquid is retained on the projection and in contact with an object supported on the object holder.

20 Claims, 6 Drawing Sheets

(56) References Cited

U.S. PATENT DOCUMENTS

| | | |
|---|---|---|
| 2005/0264778 A1 | 12/2005 | Lof et al. |
| 2006/0103830 A1 | 5/2006 | Holmes et al. |
| 2006/0285093 A1 | 12/2006 | Hara et al. |
| 2007/0109521 A1 | 5/2007 | Nishii et al. |
| 2007/0115450 A1 | 5/2007 | Nagasaka et al. |
| 2007/0188731 A1 | 8/2007 | Bezama et al. |
| 2007/0229786 A1 | 10/2007 | Kemper et al. |
| 2007/0229787 A1 | 10/2007 | Emoto |
| 2008/0158526 A1 | 7/2008 | Hennus et al. |
| 2008/0186460 A1 | 8/2008 | Auer-Jongepier et al. |
| 2009/0040481 A1 | 2/2009 | Nishikawara |
| 2010/0045949 A1 | 2/2010 | Nakano et al. |
| 2011/0116060 A1 | 5/2011 | Dziomkina et al. |
| 2011/0181849 A1 | 7/2011 | Patel et al. |

FOREIGN PATENT DOCUMENTS

| | | |
|---|---|---|
| EP | 1599073 | 6/2006 |
| EP | 2131242 | 12/2009 |
| JP | 2006-120889 | 5/2006 |
| JP | 2006-200562 | 8/2006 |
| JP | 2007-266603 | 10/2007 |
| JP | 2008-78623 | 4/2008 |
| JP | 2010-34227 | 2/2010 |
| KR | 10-2007-0109005 | 11/2007 |
| WO | 2013/178484 | 12/2013 |

OTHER PUBLICATIONS

Written Opinion of the International Searching Authority for corresponding International Patent Application No. PCT/EP2016/056235 dated Jun. 28, 2016.

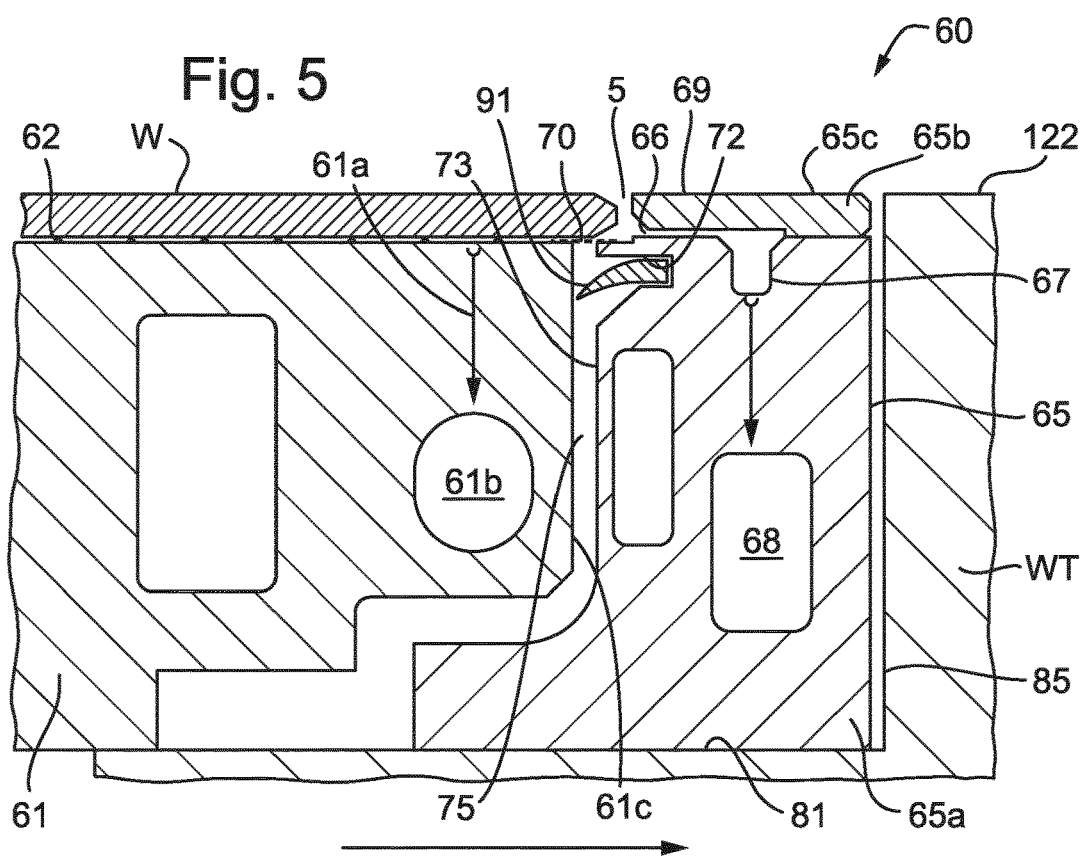
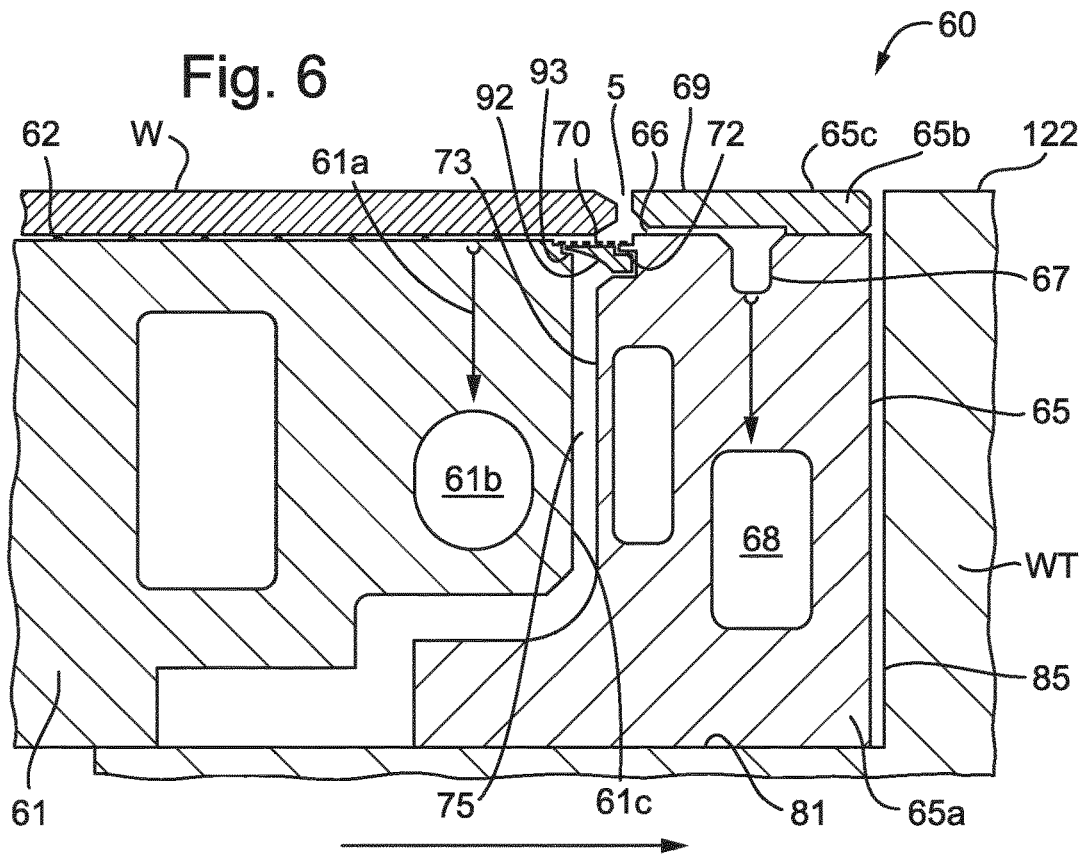

SUPPORT APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/056235, which was filed on Mar. 22, 2016, which claims the benefit of priority of EP application no. 15165563.6, which was filed on Apr. 29, 2015, and which applications are incorporated herein in its entirety by reference.

FIELD

The present invention relates to a support apparatus, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final optical element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a bather to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, such as a substrate and/or a sensor, and a table (e.g. a substrate table or a measurement table) around the edge of the object (e.g., substrate and/or sensor). U.S. patent application publication US 2005-0264778 discloses filling that gap with material or providing a liquid source or low pressure source to deliberately fill the gap with liquid in order to avoid bubble inclusion as the gap passes under the liquid supply system and/or to remove any liquid which does enter the gap.

SUMMARY

It is desirable, for example, to improve the stability of the temperature profile of an object holder of a lithographic apparatus.

According to an aspect, there is provided a support apparatus for a lithographic apparatus, comprising:

an object table having a table surface and a recess, an object holder configured to fit within the recess and to support an object having an object surface so that the object surface is substantially coplanar with the table surface;

an extraction body within the recess and radially outward of the object holder, the extraction body comprising an extraction opening configured to extract fluid, wherein the extraction body is spaced from both the object holder and the object table such that the extraction body is substantially decoupled from both the object holder and the object table; and a seal device for sealing a gap between the extraction body and the object holder, wherein the seal device comprises a flexible member which is fixed to only one of the extraction body and the object holder.

According to an aspect, there is provided a support apparatus for a lithographic apparatus, comprising:

an object table having a table surface and a recess, an object holder configured to fit within the recess and to support an object having an object surface so that the object surface is substantially coplanar with the table surface;

an extraction body within the recess and radially outward of the object holder, the extraction body comprising an extraction opening configured to extract fluid, wherein the extraction body is spaced from both the object holder and the object table such that the extraction body is substantially decoupled from the object holder and the object table; and wherein the extraction body has an inner surface that opposes an outer peripheral surface of the object holder, and a capillary portion of the inner surface is configured so that a capillary gap is formed between the outer peripheral surface and the capillary portion.

According to an aspect, there is provided a device manufacturing method using a lithographic apparatus, the method comprising:

projecting a beam patterned by a patterning device onto a substrate while supporting the substrate with a support apparatus, wherein the support apparatus comprises:

an object table having a table surface and a recess, an object holder configured to fit within the recess and to support an object having an object surface so that the object surface is substantially coplanar with the table surface;

an extraction body within the recess and radially outward of the object holder, the extraction body comprising an extraction opening configured to extract fluid, wherein the extraction body is spaced from both the object holder and the object table such that the extraction body is substantially decoupled from the object holder and the object table; and a seal device for sealing a gap between the extraction body and the object holder, wherein the seal device comprises a flexible member which is fixed to only one of the extraction body and the object holder.

According to an aspect, there is provided a device manufacturing method using a lithographic apparatus, the method comprising:

projecting a beam patterned by a patterning device onto a substrate while supporting the substrate with a support apparatus, wherein the support apparatus comprises:

an object table having a table surface and a recess, an object holder configured to fit within the recess and to support an object having an object surface so that the object surface is substantially coplanar with the table surface;

an extraction body within the recess and radially outward of the object holder, the extraction body comprising an extraction opening configured to extract fluid, wherein the extraction body is spaced from both the object holder and the object table such that the extraction body is substantially decoupled from the object holder and the object table; and wherein the extraction body has an inner surface that opposes an outer peripheral surface of the object holder, and a capillary portion of the inner surface is configured so that a capillary gap is formed between the outer peripheral surface and the capillary portion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 schematically depicts, in cross-section, a part of a support apparatus of another embodiment;

FIG. 6 schematically depicts, in cross-section, a part of a support apparatus of another embodiment;

DETAILED DESCRIPTION

Figure 1:
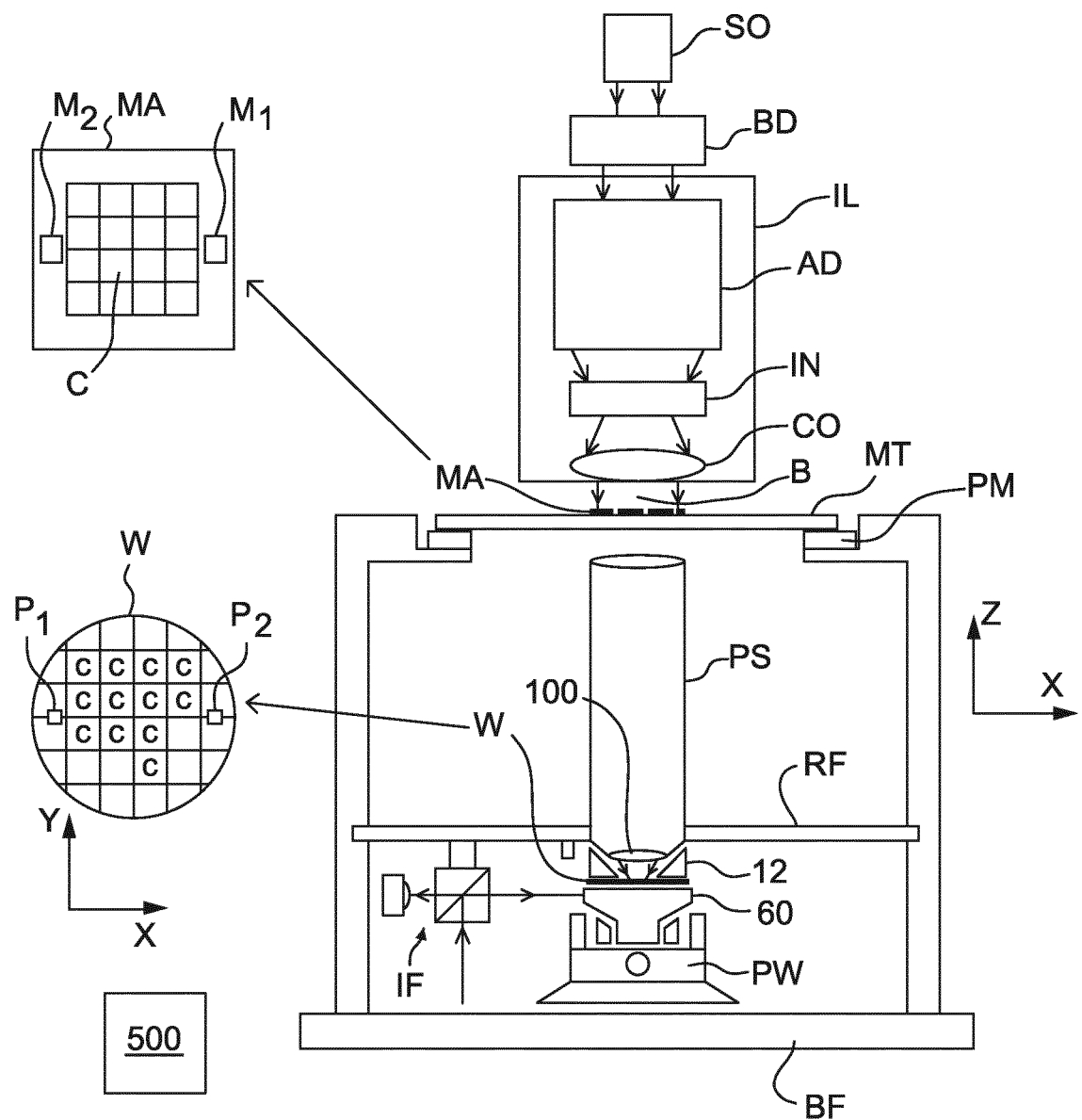
FIG. 1 schematically depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

The lithography apparatus is of a type wherein at least a portion of the substrate W may be covered by a immersion liquid 10 having a relatively high refractive index, e.g. water such as ultra pure water (UPW), so as to fill an immersion space 11 between the projection system PS and the substrate W. An immersion liquid 10 may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in immersion liquid 10; rather "immersion" only means that an immersion liquid 10 is located between the projection system PS and the substrate W during exposure. The path of the patterned radiation beam B from the projection system PS to the substrate W is entirely through immersion liquid 10.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an embodiment the controller operates the apparatus to perform an embodiment of the present invention. In an embodiment the controller 500 has a memory to store the results of a step one described herein for later use in a step two.

Arrangements for providing immersion liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

Figure 2:
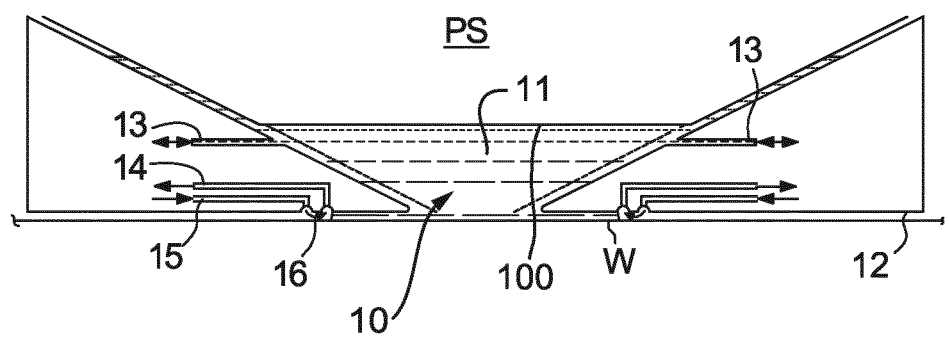
FIG. 2 schematically depicts a immersion liquid confinement structure for use in a lithographic projection apparatus.

In an arrangement which has been proposed for a localized immersion system a liquid confinement structure 12 extends along at least a part of a boundary of an immersion space 11 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, substrate table WT which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 11 between the final optical element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 (such a system with a gas seal is disclosed in European patent application publication no. EP-A-1,420,298) or an immersion liquid seal.

The liquid confinement structure 12 is configured to supply and confine immersion liquid 10 to the immersion space 11. Immersion liquid 10 is brought into the immersion space 11 through one of liquid openings 13. The immersion liquid 10 may be removed through another of liquid openings 13. The immersion liquid 10 may be brought into the immersion space 11 through at least two liquid openings 13. Which of liquid openings 13 is used to supply immersion liquid 10 and optionally which is used to remove immersion liquid 10 may depend on the direction of motion of the substrate table WT.

Immersion liquid 10 may be contained in the immersion space 11 by the gas seal 16 which, during use, is formed between the bottom of the liquid confinement structure 12 and the facing surface of the table (i.e. the surface of the substrate W and/or the surface of the substrate table WT). The gas in the gas seal 16 is provided under pressure via gas inlet 15 to a gap between the liquid confinement structure 12 and substrate W and/or substrate table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion liquid 10. The force of the gas on the immersion liquid 10 between the liquid confinement structure 12 and the substrate W and/or substrate table WT contains the immersion liquid 10 in the immersion space 11. A meniscus forms at a boundary of the immersion liquid 10. Such a system is disclosed in U.S. patent application publication no. US 2004-0207824. Other immersion liquid confinement structures 12 can be used with embodiments of the present invention.

Figure 3:
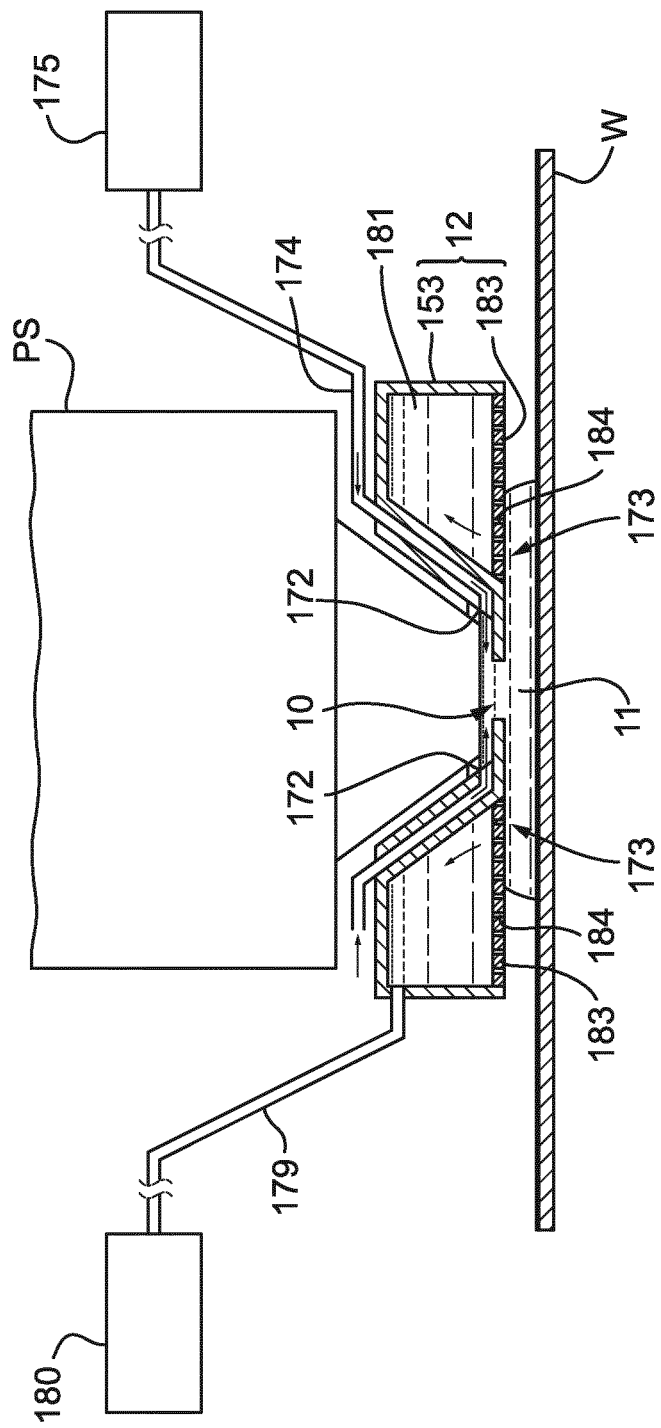
FIG. 3 is a side cross sectional view that schematically depicts a further immersion liquid supply system according to an embodiment.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the space between the final optical element of the projection system PS and the substrate table WT and/or substrate W. (Reference in the following text to surface of the substrate W also refers in addition or in the alternative to a surface of the substrate table WT, unless expressly stated otherwise.)

The liquid confinement structure 12 at least partly contains immersion liquid 10 in the immersion space 11 between the final optical element of the projection system PS and the substrate W and/or substrate table WT. The immersion space 11 is at least partly formed by the liquid confinement structure 12 positioned below and surrounding the final optical element of the projection system PS. In an embodiment, the liquid confinement structure 12 comprises a main body member 153 and a porous member 183. The porous member 183 is plate shaped and has a plurality of holes 184 (i.e., openings or pores). In an embodiment, the porous member 183 is a mesh plate wherein numerous small holes 184 are formed in a mesh. Such a system is disclosed in United States patent application publication no. US 2010/0045949 A1.

The main body member 153 comprises one or more supply ports 172, which are capable of supplying the immersion liquid 10 to the immersion space 11, and a recovery port 173, which is capable of recovering the immersion liquid 10 from the immersion space 11. The one or more supply ports 172 are connected to a liquid supply apparatus 175 via a passageway 174. The liquid supply apparatus 175 is capable of supplying the immersion liquid 10 to the one or more supply ports 172. The immersion liquid 10 that is fed from the liquid supply apparatus 175 is supplied to the one or more supply ports 172 through the corresponding passageway 174. The one or more supply ports 172 are disposed in the vicinity of the optical path at a respective prescribed position of the main body member 53 that faces the optical path. The recovery port 173 is capable of recovering the immersion liquid 10 from the immersion space 11. The recovery port 173 is connected to a liquid recovery apparatus 180 via a passageway 179. The liquid recovery apparatus 180 comprises a vacuum system and is capable of recovering the immersion liquid 10 by sucking it via the recovery port 173. The liquid recovery apparatus 180 recovers the immersion liquid 10 recovered via the recovery port 173 through the passageway 179. The porous member 183 is disposed in the recovery port 173.

In an embodiment, to form the immersion space 11 with the immersion liquid 10 between the projection system PS and the liquid confinement structure 12 on one side and the substrate W on the other side, immersion liquid 10 is supplied from the one or more supply ports 172 to the immersion space 11 and the pressure in a recovery chamber 181 in the liquid confinement structure 12 is adjusted to a negative pressure so as to recover the immersion liquid 10 via the holes 184 (i.e., the recovery port 173) of the porous member 183. Performing the liquid supply operation using the one or more supply ports 172 and the liquid recovery operation using the porous member 183 forms the immersion space 11 between the projection system PS and the liquid confinement structure 12 and the substrate W.

Figure 4:
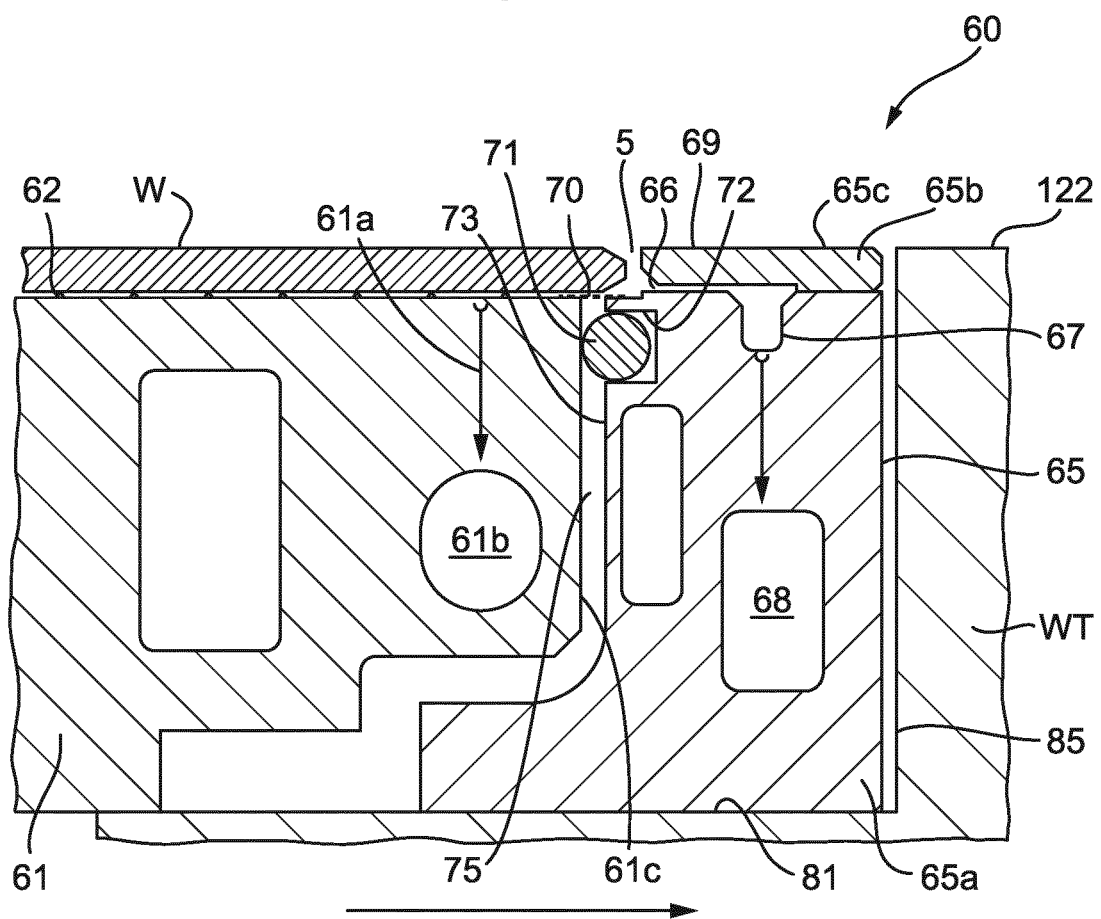
FIG. 4 schematically depicts, in cross-section, a part of a support apparatus of an embodiment.

FIG. 4 depicts an embodiment of the present invention. FIG. 4 is a cross-section through a support apparatus and an object. In an embodiment the support apparatus is a substrate support apparatus 60 and the object is a substrate W. The support apparatus comprises an object holder. The object holder is configured to hold an object. In the description below, an embodiment of the invention is described in the context of the support apparatus being a substrate support apparatus 60 and the object holder being a substrate holder 61 to hold a substrate W. However, in an embodiment, the object holder is, for example, a sensor holder to hold a sensor and the substrate support apparatus 60 is a support apparatus for the object holder, optionally not being configured to hold a substrate.

As depicted in FIG. 4, the substrate W is held by the substrate holder 61. In an embodiment, the substrate holder 61 comprises one or more projections 62 (e.g., burls). The substrate holder 61 may be termed a pimple table or a burl table.

The substrate support apparatus 60 comprises an extraction body 65. The extraction body 65 is radially outward of the substrate holder 61. In FIG. 4, the arrow below the drawing of the substrate support apparatus 60 and the substrate W indicates the radially outward direction. In an embodiment, the extraction body 65 is shaped such that the extraction body 65 surrounds, in plan view, the substrate holder 61. In an embodiment, the extraction body 65 forms a closed shape. The shape is not particularly limited and may be an annulus or a polygon, for example. In an embodiment, extraction body 65 comprises a main body 65a and a cover plate 65b.

When the edge of the substrate W is being imaged or at other times such as when the substrate W first moves under the projection system PS, the immersion liquid 10 from the immersion space 11 will pass at least partly over a gap 5 between the edge of the substrate W and the edge of the substrate support apparatus 60. This can result in immersion liquid 10 from the immersion space 11 entering the gap 5.

An under pressure applied between the substrate W and the substrate support apparatus 60 by the substrate holder 61 helps ensure that the substrate W is held firmly in place. However, if immersion liquid 10 gets between the substrate W and the substrate holder 61 this can lead to difficulties, particularly when unloading the substrate W.

The extraction body 65 is configured to extract fluid from a top surface 69 of the substrate support apparatus 60. By providing an extraction opening 66, there is a reduction in the size or number of bubbles of gas that enter the immersion liquid 10 in the immersion space 11. One or more of such bubbles can deleteriously affect the imaging of the substrate W. The extraction opening 66 is provided to reduce gas in the gap 5, between the substrate W and the substrate support apparatus 60, escaping into the immersion liquid 10 in the immersion space 11. If gas does escape into the immersion space 11, this can lead to a bubble which floats within the immersion space 11. Such a bubble, if in the path of the projection beam, can lead to imaging errors. The extraction opening 66 is to remove gas from the gap 5 between the edge of the substrate W and the edge of the recess in the substrate support apparatus 60 in which the substrate W is placed.

The extraction opening 66 extracts mostly gas (say between 20 and 100 normal liters per minute (Nl/min)) and only a small amount of immersion liquid 10 (say about 1 to 100 ml/min, and optionally 10 to 20 ml/min). With such a two-phase flow, the immersion liquid 10 evaporates, cooling down the substrate support apparatus 60 surrounding the edge of the substrate W. This can result in deformation of the substrate W, which may eventually lead to decreased overlay performance.

In an embodiment, the extraction body 65 is spaced from the substrate holder 61 such that the extraction body 65 is substantially decoupled from the substrate holder 61. The extraction body 65 is substantially thermally decoupled and/or substantially mechanically decoupled from the substrate holder 61. In an embodiment substantially the whole of the substrate holder 61 is spaced from substantially the whole of the extraction body 65.

By providing that the extraction body 65 is substantially decoupled from the substrate holder 61, a temperature load on the extraction body 65 has reduced impact on the thermo-mechanical behavior of the substrate holder 61. In particular, the effect of cooling down of the extraction body 65 on the substrate holder 61 is decreased. As mentioned above, such evaporative cooling can occur due to the two-phase flow through the extraction opening 66 of the extraction body 65. Accordingly, the stability of the temperature profile of the substrate holder 61 can be improved. Also, the thermodynamic load on the substrate W itself is reduced.

In an embodiment the object holder is a sensor holder configured to hold a sensor, and the extraction body is an edge seal member, i.e. a member which functions to seal around the edge of the sensor holder. In an embodiment the edge seal member comprises an extraction opening to extract any immersion liquid 10 which should find its way through the gap between the edge seal member and the sensor.

In an embodiment the object holder is a substrate table configured to hold a substrate, and the extraction body 65 is a sensor holder. A sensor is placed next to the substrate W. The sensor and the substrate W are supported by different supports. In an embodiment the sensor holder comprises an extraction opening to extract immersion liquid 10 which should find its way through the gap between the substrate table and the sensor.

In an embodiment, the extraction body 65 comprises a channel 68. The channel 68 is in fluid communication with the extraction opening 66 through a passageway 67. The extraction opening 66 may be provided at one or more discrete locations around the periphery (e.g., circumference) of the edge of the substrate W. The extraction opening 66 may, in plan, be slits or circular openings or any other shape. In an embodiment, three discrete circular openings are provided to extract a two-phase flow from the extraction body 65 to the substrate support apparatus 60. An extraction opening 66 may have a diameter of 2 mm. The channel 68 is connected to an under pressure so as to extract fluid through the extraction opening 66 from the top surface 69 of the substrate support apparatus 60.

In an embodiment, the extraction body 65 is non-rigidly connected to the substrate holder 61 by a seal device which is described further below. The seal device is configured to bridge an intermediate gap 75 between the extraction body 65 and the substrate holder 61. Intermediate gap 75 may have a minimum width in a direction parallel to the upper surface 69 in the range of from about 0.1 mm to 1 mm. The intermediate gap 75 prevents a good thermal contact between the substrate holder 61 and the extraction body 65.

In an embodiment, the extraction body 65 is spaced from the substrate holder 61 by an intermediate gap 75 that comprises a vacuum or a gas. A vacuum, or near vacuum, in the intermediate gap 75 reduces the thermal transfer between the extraction body 65 and the substrate holder 61.

In an embodiment, the substrate support apparatus 60 comprises a substrate table WT. The substrate holder 61 is positioned within an object holder recess of the substrate table WT. In the context of the object holder being a substrate holder 61, the object holder recess is a substrate holder recess 85 of the substrate table WT. At least part of the extraction body 65 is positioned within the substrate holder recess 85. As depicted in FIG. 4, in an embodiment substantially all of the extraction body 65 is positioned within the substrate holder recess 85. However, this need not necessarily be the case. In an embodiment part of the extraction body 65 extends beyond the substrate holder recess 85.

As depicted in FIG. 4, the extraction body 65 is connected to the substrate table WT in substrate holder recess 85 at an interface 81. The interface 81 provides a connection between the extraction body 65 and the substrate table WT. Acceleration forces of the substrate WT are transferred to the extraction body 65 via the interface 81. The interface 81 provides a stiff connection to the extent that the interface 81 transfers accelerating forces from the substrate table WT to the extraction body 65. The stiffness of the connection at the interface 81 is desirably minimal so as to reduce thermal transfer between the extraction body 65 and the substrate table WT.

In an embodiment, the interface 81 is at a bottom surface and/or a radial surface (e.g. a radially outward edge) of the extraction body 65. In an embodiment, the interface 81 is at an outer surface of the extraction body 65.

The form of connection at the interface 81 is not particularly limited. In an embodiment, the extraction body 65 is connected to the substrate table WT by vacuum clamping, bolting, gluing, and/or kinematic leaf spring coupling.

In an embodiment, the interface 81 comprises one or more burls. In an embodiment the connection area between the burl and the substrate table WT is smaller than the contact surface between the burl and the extraction body 65. This provides the burl with extra flexibility.

In an embodiment, the surfaces of the gap 5 are provided with a hydrophobic coating. The hydrophobic coating helps to reduce the loss of immersion liquid 10 from the top surface 69 of the substrate support apparatus 60 through the intermediate gap 75.

In an embodiment, the extraction body 65 is made of a metal, e.g. titanium. In an embodiment, the extraction body 65 is made of the same material as the substrate holder 61. In an embodiment, both the substrate holder 61 and the extraction body 65 are formed of aluminum, SiC, SiSiC, or a diamond-like material, for example. By matching the material of the extraction body 65 with the material of the substrate holder 61, thermo-mechanical cross-talk between the substrate holder 61 and the extraction body 65 can be reduced.

In an embodiment, the extraction body 65 is made from the same material as the substrate table WT. In an embodiment, both the extraction body 65 and the substrate table WT are formed from a glass-ceramic, such as Zerodur®, or cordierite, for example.

In an embodiment, the extraction body 65 comprises a main body 65a and a cover ring 65b. The cover ring 65b is positioned at a top surface of the main body 65a. In an embodiment, the cover ring 65b is monolithic with the main body 65a. In an embodiment, the cover ring 65b is a separate body from the main body 65a. By providing the cover ring 65b at the top of the extraction body 65 that would come into contact with the immersion liquid 10 in normal use, a thermal load in the extraction opening 66, passageway 67 and channel 68 have a reduced thermal effect on the liquid confinement structure 12. In an embodiment, cover ring 65b is formed of titanium, SiC, SiSiC, or a diamond-like material, for example.

In an embodiment, when the substrate W is held by the substrate holder 61, the top surface of the substrate W is substantially coplanar with the top surface 65c of the extraction body 65. In an embodiment, the top surface 65c of the extraction body 65 is substantially coplanar with the top surface 122 of the substrate table WT.

In an embodiment, a gap between the cover ring 65b and the top surface 122 of the substrate table WT is bridged by a thin film seal (not shown). The thin film seal can have various constructions. In an embodiment, the thin film seal comprises an adhesive layer and a film layer. The adhesive layer adheres the film layer to the top surface 122 of the substrate table WT and to the extraction body 65. In an embodiment, the thin film seal has a thickness of less than or equal to 50 micrometers, less than or equal 10 micrometers, or about 10 micrometers.

In an embodiment, the substrate support apparatus 60 comprises a liquid extractor 61a, 61b. The liquid extractor 61a, 61b is radially inward of the extraction opening 66. The liquid extractor 61a, 61b is configured to extract liquid from a top surface of the substrate holder 61.

The liquid extractor 61a, 61b is provided to help prevent any liquid which finds its way from the gap 5 to underneath the substrate W from preventing efficient release of the substrate W from the substrate holder 61 after imaging. The provision of the liquid extractor 61a, 61b reduces or eliminates a problem which may occur due to liquid finding its way underneath the substrate W. The liquid extractor 61a, 61b, like the extraction opening 66, removes fluid by way of an under pressure.

The liquid extractor 61a, 61b comprises an opening (not shown) and a channel 61b. The channel 61b is in fluid communication with the opening through a passageway 61a. The opening may be provided at one or more discrete locations around the periphery of the edge of the substrate W and may, in plan, be slits or circular openings or any other shape. In an embodiment, three discrete (circular) openings are provided around the edge of the substrate W, for instance.

In an embodiment, the liquid extractor 61a, 61b comprises a liquid extractor conditioning system configured to supply heat energy to and/or remove heat energy from the liquid extractor 61a, 61b. The liquid extractor conditioning system is a thermal conditioning system.

In an embodiment, the extraction body 65 comprises an extraction body conditioning system configured to supply heat energy to and/or remove heat energy from the extraction body 65. The extraction body conditioning system is a thermal conditioning system. In an embodiment, the thermal conditioning system comprises a plurality of conditioning units that are independently controllable. Each of the plurality of conditioning units is configured to supply heat energy to and/or remove heat energy from a respective conditioning region of the extraction body 65. In an embodiment, a conditioning unit comprises a heater and a temperature sensor (not shown). In an embodiment, the heaters and temperature sensors are positioned adjacent to the channel 68 that is in fluid communication with the extraction opening 66 of the extraction body 65. Conditioning units can also be placed at other positions in the extraction body 65. The heaters and temperature sensors may be integrated with each other.

The heaters and temperature sensors are independently controllable. The temperature sensor is configured to sense the temperature of the channel 68. The heater is configured to supply heat energy to the channel 68. In an embodiment, the controller 500 controls the heater/temperature sensors so as to maintain the channel 68 (or another component of the substrate support apparatus 60) at a certain (e.g., predetermined) temperature. A Peltier device may be used as a heater.

In an embodiment, the thermal conditioning system comprises a network of fluid-carrying channels (not shown) configured to control the temperature of the component, such as the extraction body 65. In an embodiment, the fluid-carrying channels carry a thermal conditioning liquid. The thermal conditioning liquid may be water, for example. The fluid-carrying channels maintain the temperature of the extraction body 65 at a certain (e.g., predetermined) temperature. In an embodiment, one or more heaters and/or temperature sensors (not shown) may be positioned in or near the fluid-carrying channels so as to control the temperature of the thermal conditioning liquid within the fluid-carrying channels.

In an embodiment the fluid-carrying channels carry a phase change material. In such a system the phase change material is chosen such that it changes phase at a desired set point temperature and is therefore capable of transferring heat much more efficiently than a fluid which does not change phase.

In an embodiment, the fluid-carrying channels carry carbon dioxide as the fluid. The fluid-carrying channels may be termed cooling channels. In an embodiment, the fluid-carrying channels contain carbon dioxide at a pressure such that the carbon dioxide has a boiling point of at most 30° C., and optionally at most 22° C. The carbon dioxide helps maintain the temperature of the extraction body 65. For example, excess heat in the extraction body 65 above the boiling point of the carbon dioxide contained in the fluid-carrying channels can be transferred to the carbon dioxide. This excess heat causes the carbon dioxide to boil.

In an embodiment, the thermal conditioning system comprises a heat pipe (not shown). In an embodiment, the heat pipe is positioned around the channel 68. By providing a heat pipe around the channel 68, the temperature of the channel 68 can be easily controlled. This is due to the fact that a heat pipe has a very large "conductivity".

In an embodiment, at least a part of the heat pipe is positioned between the channel 68 and the substrate holder 61. This reduces the transfer of heat between the extraction body 65 and the substrate holder 61. The temperature of the heat pipe is very homogeneous due to the homogeneous pressure within the heat pipe. The heat pipe contains a working fluid that can evaporate to vapor, thereby absorbing thermal energy. The vapor migrates along the cavity of the heat pipe to a region at a lower temperature. The vapor then condenses back into the working fluid and is absorbed by a wick in the heat pipe. This condensation releases thermal energy. The working fluid then flows back to a higher temperature region of the heat pipe. In this way, the temperature of the heat pipe remains substantially homogeneous.

In an embodiment, the heat pipe comprises a working fluid selected from the group consisting of water, acetone, ethanol, methanol, ammonia, 2-butane, DME, 1,1,1,2-tetrafluoroethane and propane. Other working fluids may be suitable.

In an embodiment, the thermal conditioning system comprises a heat pipe and at least one heater/temperature sensor. The heater/temperature sensor is configured to apply energy to the heat pipe. This sets the saturation pressure for the working fluid in the heat pipe.

In an embodiment of the invention, the extraction body 65 can be as described in WO 2013/178484.

In an embodiment, the seal device, which seals against leakage of immersion liquid 10 and/or gas through intermediate gap 75, comprises a flexible member that is secured to only one of the extraction body 65 and the substrate holder 61. In this embodiment the flexible member is an O-ring 71 which is secured in a groove 72 provided in an inner surface 73 of the extraction body 65. Inner surface 73 may be annular in shape. O-ring 71 can be secured in groove 72 simply due to the relative sizes of the groove 72 and the O-ring 71 and the intrinsic resilience of the O-ring 71. Alternatively or in addition, adhesive may be used to secure O-ring 71 to extraction body 65. If adhesive is used, the groove 72 can be reduced in depth or eliminated. The depth of groove 72 may be up to about 75% of the cross-section diameter of O-ring 71.

When in position, O-ring 71 has an inner diameter slightly smaller than the outer diameter of the substrate holder 61 and an outer diameter slightly greater than the diameter of the inner surface 73 of the extraction body 65. For a substrate holder 61 configured to support a substrate W of standard diameter, e.g. 300 mm or 450 mm, the inner and outer diameters of the O-ring 71 may similar to the diameter of the substrate W. The uncompressed cross-sectional diameter of the O-ring 71 may be in the range of from 0.5 mm to 2 mm, preferably 1 mm to 1.5 mm. The cross-sectional diameter of O-ring 71 is larger than the width of intermediate gap 75.

The O-ring 71 can comprise a fluoroelastomer (e.g. as sold by DuPont under the trade name Viton®) or other elastomeric material. A fluoroelastomer can be advantageous as such materials can be highly resistant to degradation by DUV radiation. O-ring 71 can be provided with a surface layer or coating of a different material that assists in protecting O-ring 71 from degradation by DUV radiation or other causes. Such a coating may be of PTFE or metal, for example.

O-ring 71 can be manufactured by various techniques, including injection molding, extrusion and welding, or milling from a chilled block of material.

The very narrow clearance between substrate holder 61 and extraction body 65 makes assembly of the support apparatus 60 difficult. An approach to assembling the support apparatus 60 is to first locate the extraction body 65 within recess 85. This can be reasonably easy since the clearance between the outer periphery of extraction body 65 and the recess 85 can be made as large as is convenient. Then, the substrate holder 61 is lowered into the space within extraction body 65. This step is more difficult because of the narrowness of intermediate gap 75. It is important to avoid contact between the substrate holder 61 and extraction body 65 because such contact can result in damage to either component and/or the creation of contaminant particles. Since both the substrate holder 61 and extraction body 65 are made of hard materials, a collision can easily create contaminant particles. The substrate holder 61 is regarded as a removable component of the lithographic apparatus and may be removed for servicing and/or replacement several times during the life of the lithographic apparatus.

The seal device of the present embodiment can assist in assembling the support apparatus 60. The flexible seal member, e.g. O-ring 71, assists in centering the substrate holder 61 as it is lowered into the extraction body 65 and prevents collisions between the hard surfaces of the substrate holder 61 and extraction body 65 so preventing generation of contaminant particles. Since the substrate holder 61 may be removed for servicing or replacement, an improvement in ease of assembly of the support apparatus 60 provides benefit throughout the life of the lithographic apparatus.

The flexible seal member (e.g. O-ring 71) bears against the outer peripheral surface 61c of the substrate holder 61 rather than the upper surface thereof. This means that burls 62 can be provided on the upper surface of the substrate holder 61 right to its edge, improving the uniformity of support of the substrate W. A seal which seals to the upper surface of the substrate holder 61 would require an area adjacent the edge of the substrate holder 61 that is free of burls 62. The substrate W would then be unsupported in the area adjacent the edge of the substrate holder 61 that is free of burls 62 and might deform in that area. Deformation of the substrate W might lead to imaging errors.

O-ring 71 connects the substrate holder 61 to the extraction body 65 and hence could compromise the effect of decoupling the extraction body 65 from the substrate holder 61. However the material of O-ring 71 has a low thermal conductivity (e.g. in the range of from 0.1 to 1.0 W/mK and a low cross-sectional area of contact with the substrate holder 61 (e.g. less than about 0.001 $m^2$ or less than about 0.02 $m^2$ for a 300 mm wafer) so that the heat conduction from substrate holder 61 to extraction body 65 is low. Similarly the Young's modulus is in the range of from 0.01 to 1.0 GPa so that the force transfer is also small. If O-ring 71 is solid it can have a stiffness in the range of from 1 to 10 MN/m. If O-ring 71 is hollow it can have a stiffness in the range of from 0.1 to 1 MN/m. Therefore, the presence of the flexible seal member does not significantly compromise either the thermal decoupling or the mechanical decoupling of the extraction body 65 from the substrate holder 61.

In an embodiment the seal device further comprises a sticker 70, which can also be referred to as a thin film seal. The sticker 70 is arranged to protect the O-ring 71 from degradation by DUV radiation. In an embodiment, the sticker 70 helps to seal the intermediate gap 75. The sticker 70 is optional and in particular may be omitted if the arrangement of substrate W, cover plate 65b and extraction body 65 is such that DUV radiation cannot reach O-ring 71. If sticker 70 is provided, it need not make a liquid tight seal to the substrate holder 61 and therefore the area of overlap between the sticker 70 and substrate holder 61 can be reduced compared to the case where a liquid tight seal must be made. This means that burls 62 can be provided closer to the edge of substrate holder 61 reducing the unsupported area of the substrate W.

In an embodiment, the sticker 70 comprises an adhesive layer and a film layer. The adhesive layer adheres the film layer to the substrate holder 61 and to the extraction body 65. The sticker 70 helps prevent fluid from entering the intermediate gap 75 between the substrate holder 61 and the extraction body 65. In an embodiment, the sticker 70 has a thickness of less than or equal to 50 micrometers, less than or equal 10 micrometers, or about 10 micrometers.

FIG. 5 depicts in cross-section part of a support apparatus according to another embodiment of the invention. In the interests of brevity, parts of the embodiment of FIG. 5 that are the same as the corresponding parts of the embodiment of FIG. 4 are not described further below.

In the embodiment of FIG. 5, the flexible seal member is a lip seal 91. Lip seal 91 may be formed of the same materials as O-ring 71 and manufactured by the same techniques. Lip seal 91 is secured in groove 72 by its inherent resilience and/or by the use of adhesive, as before.

Lip seal 91 bears against the outer peripheral surface 61c of substrate holder 61 and is deflected downwards as the substrate holder 61 is lowered into place inside the extraction body 65. The lip seal 91 may have a smaller cross-sectional area than O-ring 71 and so thermal coupling and mechanical coupling between the substrate holder 61 and extraction body 65 are further reduced.

FIG. 6 depicts in cross-section part of a support apparatus according to another embodiment of the invention. In the interests of brevity, parts of the embodiment of FIG. 6 that are the same as the corresponding parts of the embodiments of FIGS. 6 and 7 are not described further below.

In the embodiment of FIG. 6, the flexible member is a lip seal 92. Lip seal 92 differs from lip seal 91 in that it bears on a top surface of the substrate holder 61. A niche 93 may be provided at the upper edge of substrate holder 61 to accommodate lip seal 92. During assembly of the substrate support apparatus 60, after insertion of the substrate holder 61, lip seal 92 may need to be released to sit in niche 93 rather than bear against the outer peripheral surface 61c. The edge of lip seal 92 can be attached to niche 93 by adhesive.

Compared to lip seal 91, lip seal 92 yet further reduces the mechanical coupling and thermal coupling between substrate holder 61 and extraction body 65.

Figure 7:
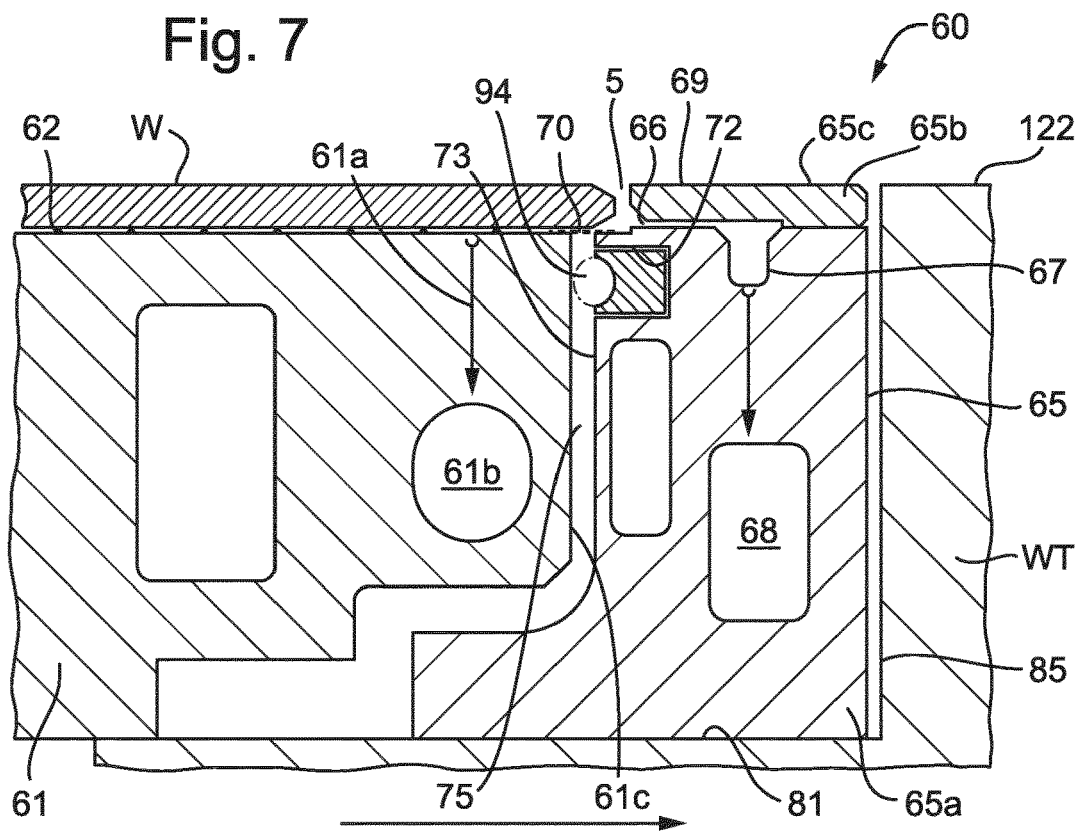
FIG. 7 schematically depicts, in cross-section, a part of a support apparatus of another embodiment.

FIG. 7 depicts in cross-section part of a support apparatus according to another embodiment of the invention. In the interests of brevity, parts of the embodiment of FIG. 7 that are the same as the corresponding parts of the previous embodiments are not described further below.

In the embodiment of FIG. 7, the flexible member is an inflatable ring seal 94. Inflatable ring seal 94 can be formed of the same materials as O-ring 71 and manufactured by the same techniques. Inflatable ring seal 94 is secured in groove 72 by its inherent resilience and/or by the use of adhesive, as before. A pressure source and control system (not shown) is provided to control the pressure of a gas, e.g. extremely clean dry air, within inflatable ring seal 94. Thus, the substrate support apparatus 60 can be assembled with the inflatable ring seal 94 in a deflated state and the inflatable ring seal 94 inflated after the substrate holder 61 has been placed inside the extraction body 65. In this way the force exerted by the inflatable ring seal 94 on substrate holder 61 and extraction body 65 can be kept to a minimum whilst still ensuring a seal of the intermediate gap 75.

Figure 8:
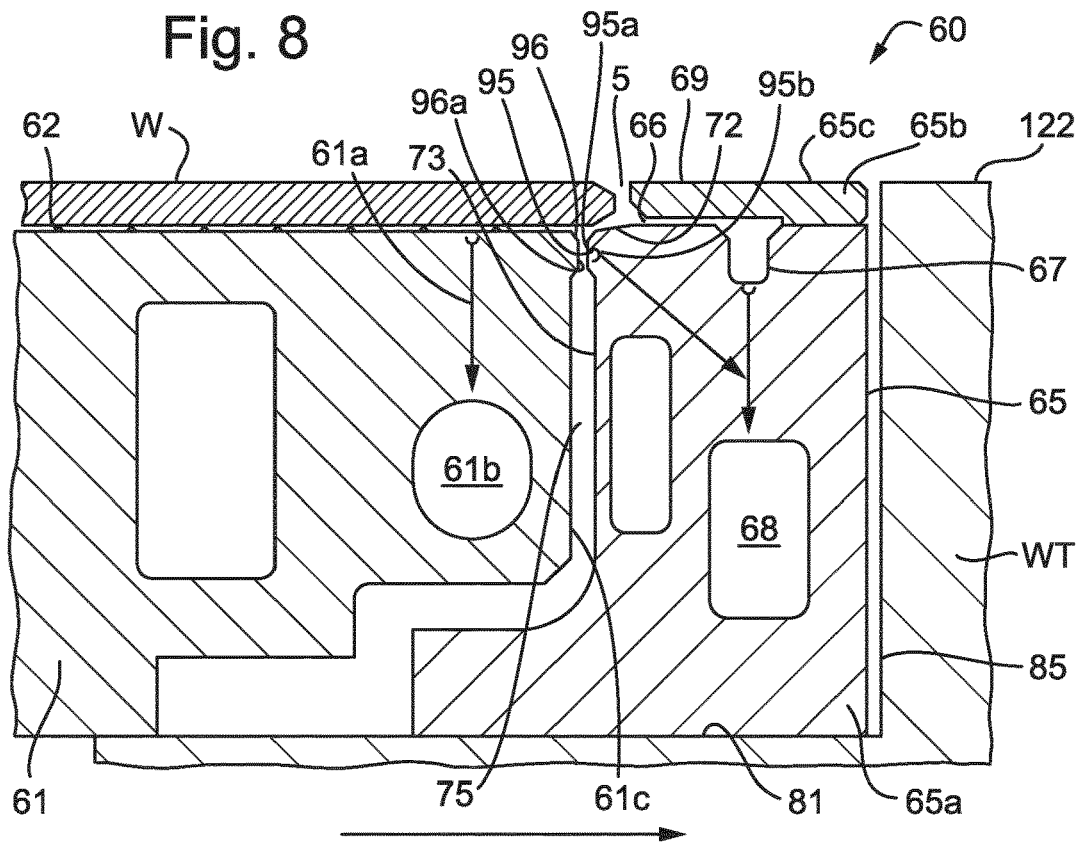
FIG. 8 schematically depicts, in cross-section, a part of a support apparatus of another embodiment.

FIG. 8 depicts in cross-section part of a support apparatus according to another embodiment of the invention. In the interests of brevity, parts of the embodiment of FIG. 8 that are the same as the corresponding parts of the previous embodiments are not described further below.

In the embodiment of FIG. 8, the seal device comprises a capillary seal. A projection 95 is provided on the inner surface 73 of extraction body 65 and defines a capillary surface 95a. Optionally, a corresponding projection 96 is provided on the outer peripheral surface 61c of substrate holder 61. Projection 96 likewise defines a capillary surface 96a. Capillary surfaces 95a and 96a define between them a capillary gap that is configured so that capillary forces are exerted on any immersion liquid 10 entering the capillary gap and control the flow of immersion liquid 10 through the capillary gap. If projection 96 is not provided on the substrate holder 61, the size of projection 95 on extraction body 65 can be adjusted to ensure that the capillary gap is formed between the capillary surface 95a and a part of outer peripheral surface 61c of substrate holder 61. Capillary surface 95a, capillary surface 96a (if present) and/or at least part of outer peripheral surface 61c can be provided with a coating or surface treatment to increase their hydrophobicity.

A liquid extraction opening 95b is provided in or near capillary surface 95a and is in fluid communication with channel 68 so that any immersion liquid 10 in the capillary gap may be removed along with the immersion liquid 10 that is removed from the gap 5 via extraction opening 66.

Compared even with the other embodiments of the invention, the embodiment of FIG. 8 reduces the mechanical coupling between substrate holder 61 and extraction body 65.

In an embodiment, there is provided a support apparatus for a lithographic apparatus, comprising: an object table having a table surface and a recess; an object holder configured to fit within the recess and to support an object having an object surface so that the object surface is substantially coplanar with the table surface; an extraction body within the recess and radially outward of the object holder, the extraction body comprising an extraction opening configured to extract fluid, wherein the extraction body is spaced from both the object holder and the object table such that the extraction body is substantially decoupled from both the object holder and the object table; and a seal device for sealing a gap between the extraction body and the object holder, wherein the seal device comprises a flexible member which is fixed to only one of the extraction body and the object holder.

In an embodiment, the seal device is fixed to the extraction body. In an embodiment, the extraction body has an inner surface that opposes an outer peripheral surface of the object holder and the seal device is fixed to the inner surface. In an embodiment, the inner surface of the extraction body has a groove and the seal device is fixed in the groove. In an embodiment, the seal device is fixed to the one of the extraction body and the object holder by adhesive. In an embodiment, the seal device comprises an O-ring. In an embodiment, the seal device comprises a lip seal having a proximal edge fixed to the one of the extraction body and the object holder and a distal edge that bears against the other of the extraction body and the object holder. In an embodiment, the distal edge of the lip seal bears against a surface of the other of the extraction body and the object holder that is substantially perpendicular to the table surface. In an embodiment, the distal edge of the lip seal bears against a surface of the other of the extraction body and the object holder that is substantially parallel to the table surface. In an embodiment, the seal device comprises a hollow member having a gas port through which gas can be provided to the interior of the hollow member so as to cause the hollow member to expand.

In an embodiment, there is provided a lithographic apparatus comprising the support apparatus as described herein, In an embodiment, there is provided a device manufacturing method using a lithographic apparatus, the method comprising: projecting a beam patterned by a patterning device onto a substrate while supporting the substrate with a support apparatus, wherein the support apparatus comprises: an object table having a table surface and a recess; an object holder configured to fit within the recess and to support an object having an object surface so that the object surface is substantially coplanar with the table surface; an extraction body within the recess and radially outward of the object holder, the extraction body comprising an extraction opening configured to extract fluid, wherein the extraction body is spaced from both the object holder and the object table such that the extraction body is substantially decoupled from the object holder and the object table; and a seal device for sealing a gap between the extraction body and the object holder, wherein the seal device comprises a flexible member which is fixed to only one of the extraction body and the object holder.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A support apparatus for a lithographic apparatus, comprising:
   an object table having a table surface and a recess;
   an object holder configured to fit within the recess and to support an object having an object surface so that the object surface is substantially coplanar with the table surface; and
   an extraction body within the recess and radially outward of the object holder, the extraction body comprising an extraction opening configured to extract fluid, wherein the extraction body is spaced from both the object holder and the object table such that the extraction body is substantially decoupled from the object holder and the object table,
   wherein the extraction body has an inner surface that opposes an outer peripheral surface of the object holder, and a capillary portion of the inner surface is configured so that a capillary gap is formed between the outer peripheral surface and the capillary portion.

2. The support apparatus of claim 1, wherein the extraction body has a gap extraction opening configured to extract fluid from the capillary gap.

3. The support apparatus of claim 1, wherein the capillary portion extends for only a part of the inner surface.

4. The support apparatus of claim 1, wherein the extraction body comprises an extraction body conditioning system configured to supply heat energy to and/or remove heat energy from the extraction body.

5. The support apparatus of claim 1, wherein the inner surface and/or outer peripheral surface has a coating or surface treatment to increase hydrophobicity thereof.

6. The support apparatus of claim 1, wherein the inner surface is located on a projection from the extraction body and/or the outer peripheral surface is located on a projection from the object holder.

7. The support apparatus of claim 1, wherein the capillary gap is elongate in the essentially vertical direction.

8. A device manufacturing method using a lithographic apparatus, the method comprising:
   projecting a beam patterned by a patterning device onto a substrate while supporting the substrate with a support apparatus,
   wherein the support apparatus comprises:
      an object table having a table surface and a recess;
      an object holder configured to fit within the recess and to support an object having an object surface so that the object surface is substantially coplanar with the table surface; and
      an extraction body within the recess and radially outward of the object holder, the extraction body comprising an extraction opening configured to extract fluid, wherein the extraction body is spaced from both the object holder and the object table such that the extraction body is substantially decoupled from the object holder and the object table,
      wherein the extraction body has an inner surface that opposes an outer peripheral surface of the object holder, and a capillary portion of the inner surface is configured so that a capillary gap is formed between the outer peripheral surface and the capillary portion.

9. The method of claim 8, wherein the extraction body has a gap extraction opening and further comprising extracting fluid from the capillary gap by the extraction opening.

10. The method of claim 8, wherein the capillary portion extends for only a part of the inner surface.

11. The method of claim 8, wherein the extraction body comprises an extraction body conditioning system and further comprising supplying heat energy to and/or removing heat energy from, the extraction body by the extraction body conditioning system.

12. The method of claim 8, wherein the inner surface and/or outer peripheral surface has a coating or surface treatment to increase hydrophobicity thereof.

13. The method of claim 8, wherein the inner surface is located on a projection from the extraction body and/or the outer peripheral surface is located on a projection from the object holder.

14. A lithographic apparatus comprising:
an object table having a table surface and a recess;
an object holder configured to support an object having an object surface so that the object surface is substantially coplanar with the table surface; and
an extraction body within the recess and radially outward of the object holder, the extraction body comprising an extraction opening configured to extract fluid, wherein the extraction body is spaced from both the object holder and the object table such that the extraction body is substantially decoupled from the object holder and the object table,
wherein the extraction body has an inner surface that opposes an outer peripheral surface of the object holder, and wherein a capillary portion of the inner surface is configured so that a capillary gap is formed between the outer peripheral surface and the capillary portion; and
a projection system configured to project a beam of radiation onto a substrate.

15. The lithographic apparatus of claim 14, wherein the extraction body has a gap extraction opening configured to extract fluid from the capillary gap.

16. The lithographic apparatus of claim 14, wherein the capillary portion extends for only a part of the inner surface.

17. The lithographic apparatus of claim 14, wherein the extraction body comprises an extraction body conditioning system configured to supply heat energy to and/or remove heat energy from the extraction body.

18. The lithographic apparatus of claim 14, wherein the inner surface and/or outer peripheral surface has a coating or surface treatment to increase hydrophobicity thereof.

19. The lithographic apparatus of claim 14, wherein the inner surface is located on a projection from the extraction body and/or the outer peripheral surface is located on a projection from the object holder.

20. The lithographic apparatus of claim 14, wherein the capillary gap is elongate in the essentially vertical direction.

* * * * *

UNITED STATES PATENT AND TRADEMARK OFFICE
CERTIFICATE OF CORRECTION

PATENT NO. : 10,578,959 B2
APPLICATION NO. : 15/567279
DATED : March 3, 2020
INVENTOR(S) : Gijs Kramer et al.

Page 1 of 1

It is certified that error appears in the above-identified patent and that said Letters Patent is hereby corrected as shown below:

On the Title Page

On page 2, item (56) References Cited, Foreign Patent Documents:
Please correct "EP 1599073, 06/2006" to -- EP 1699073, 09/2006 --

Signed and Sealed this
Fifth Day of May, 2020

Andrei Iancu
*Director of the United States Patent and Trademark Office*